(12) United States Patent
Lee et al.

(10) Patent No.: US 8,203,199 B2
(45) Date of Patent: Jun. 19, 2012

(54) TIE BAR AND MOLD CAVITY BAR ARRANGEMENTS FOR MULTIPLE LEADFRAME STACK PACKAGE

(75) Inventors: Lee Han Meng Eugene Lee, Muar (MY); Kuan Yee Woo, Tampin (MY)

(73) Assignee: National Semiconductor Corporation, Santa Clara, CA (US)

( * ) Notice: Subject to any disclaimer, the term of this patent is extended or adjusted under 35 U.S.C. 154(b) by 384 days.

(21) Appl. No.: 12/635,059

(22) Filed: Dec. 10, 2009

(65) Prior Publication Data

US 2011/0140249 A1 Jun. 16, 2011

(51) Int. Cl.
*H01L 23/495* (2006.01)
(52) U.S. Cl. ........... 257/670; 438/124; 257/667
(58) Field of Classification Search ........ 257/667, 257/672, 673, 676, 670; 438/124
See application file for complete search history.

(56) References Cited

U.S. PATENT DOCUMENTS

| | | | |
|---|---|---|---|
| 5,926,695 A | 7/1999 | Chu et al. | |
| 5,994,768 A | 11/1999 | Fogelson | |
| 6,061,251 A | 5/2000 | Hutchinson et al. | |
| 6,064,115 A | 5/2000 | Moscicki | |
| 6,066,515 A | 5/2000 | Schoenfeld et al. | |
| 6,072,228 A | 6/2000 | Hinkle et al. | |
| 6,215,176 B1 | 4/2001 | Huang et al. | |
| 6,372,579 B1 | 4/2002 | Tung | |
| 6,448,107 B1 | 9/2002 | Hong et al. | |
| 6,483,180 B1 | 11/2002 | Bayan et al. | |
| 6,580,161 B2 * | 6/2003 | Kobayakawa | 257/676 |
| 7,687,899 B1 * | 3/2010 | Berry | 257/687 |
| 2002/0024857 A1 | 2/2002 | Stave | |
| 2003/0209804 A1 * | 11/2003 | Knapp et al. | 257/734 |
| 2007/0001274 A1 | 1/2007 | Hinkle et al. | |
| 2011/0089546 A1 * | 4/2011 | Bayan | 257/676 |

FOREIGN PATENT DOCUMENTS

JP 06-177315 6/1994

OTHER PUBLICATIONS

Search Report dated Feb. 28, 2011 from International Application No. PCT/US2010/045802.
Written Opinion dated Feb. 28, 2011 from International Application No. PCT/US2010/045802.
Search Report dated Feb. 28, 2011 from International Application No. PCT/US2010/045803.
Written Opinion dated Feb. 28, 2011 from International Application No. PCT/US2010/045803.
U.S. Appl. No. 12/581,065, filed Oct. 16, 2009.

* cited by examiner

*Primary Examiner* — Kiesha Bryant
*Assistant Examiner* — Mark Tornow
(74) *Attorney, Agent, or Firm* — Wade J. Brady, III; Frederick J. Telecky, Jr.

(57) ABSTRACT

A semiconductor chip package having multiple leadframes is disclosed. Packages can include a first leadframe having a first plurality of electrical leads and a die attach pad having a plurality of tie bars, a second leadframe generally parallel to the first leadframe and having a second plurality of electrical leads, and a mold or encapsulant. Tie bars can be located on three main sides of the die attach pad, but not the fourth main side. Gaps in the first and second plurality of electrical leads can be enlarged or aligned with each other to enable the elimination of mold flash outside the encapsulated region, which can be accomplished with mold cavity bar protrusions. Additional components can include a primary die, a secondary die, an inductor and/or a capacitor. The first and second leadframes can be substantially stacked atop one another, and one or both leadframes can be leadless leadframes.

18 Claims, 9 Drawing Sheets

TIE BAR AND MOLD CAVITY BAR ARRANGEMENTS FOR MULTIPLE LEADFRAME STACK PACKAGE

TECHNICAL FIELD

The present invention relates generally to the packaging of integrated circuit devices, and more particularly to the use of leadframe packages for multiple chip modules, system in package arrangements, or other complex components.

BACKGROUND

Many integrated circuit ("IC") device packages utilize a metal leadframe to provide electrical interconnects between an integrated circuit die and external components. Such leadframes generally include numerous metal leads that extend away from a die and that are contained within the same general plane, so as to facilitate the ready manufacture of the same leadframe in mass quantities. Many leadframes also include a die attach pad ("DAP") within the same general plane as the metal leads, typically at or near their center. The DAP can support the die during assembly of the package, provide a ground or other electrical contact for the package, and can also help with thermal management of the package by providing a good thermal conduction path for dissipating excess heat generated by the die.

While early leadframe designs typically provided a DAP and metal electrical leads for a single die, technological advances have resulted in more complex components than single die packages. Complex components that can utilize leadframes include, for example, the multi-chip module ("MCM") and system in package ("SIP") IC arrangements, among others. Both MCMs and SIPs can have multiple chips and/or other components all within a single package, which tends to result in savings in both space and cost with respect to traditional arrangements that would include all of the same or similar chips or components, typically spread out across multiple packaged components.

Although MCMs and SIPs represent improvements over simpler conventional IC designs, these relatively complex devices do require many electrical contacts in a restricted amount of space. The generally planar nature of a traditional single leadframe, when combined with this complexity of an MCM or SIP, can result in a sophisticated device that still has a rather large footprint in comparison with other IC devices. As will be generally understood, it is typically not desirable to have IC devices that present relatively large footprints, particularly when it comes to portable devices, such as cellular telephones, personal digital assistants, media play devices, and the like. IC device packages that result in smaller device footprints are generally desirable, since smaller device footprints tend to result in greater assembly yields and reduced unit costs. Examples of packages that utilize more advanced leadframe structures, such as for more complex IC arrangements, can be found at, for example, U.S. Pat. Nos. 5,994,768; 6,072,228; and 6,215,176, among other similar references. Of course, the introduction of multi-layer and/or multi-part leadframe structures, such as those in the foregoing references, tends to result in additional problems and issues that are not found in simpler leadframe arrangements.

While many of the devices and techniques used to package IC devices have generally worked well in the past, there is always a desire to provide improved ways for packaging IC devices. In particular, complex leadframe based packages for MCMs, SIPs or other complex IC structures that provide reliable performance within a relatively small overall footprint are desired.

SUMMARY

It is an advantage of the present invention to provide improved packages for complex integrated circuit arrangements that utilize a leadframe while still managing to occupy a small footprint for the overall chip package. This can be accomplished at least in part through the use of a plurality of separate leadframes arranged in a stacked formation with respect to each other and a primary die. Reliability of and small overall spacing for these complex multiple leadframe packages are maintained at least in part due to an alternative DAP tie bar arrangement and also an adjusted manufacturing process that enables the removal of mold flash in a more complex stacked leadframe structure.

In various embodiments, an integrated circuit device or package includes a first leadframe, a second leadframe, and an encapsulant that binds and protects various portions of the first and second leadframes within an encapsulated region. The first leadframe generally defines a first plane and has a DAP adapted to couple to an associated primary die, a first plurality of electrical leads adapted to couple to the associated primary die and having a first set of one or more gaps therebetween, and a plurality of tie bars coupled to the DAP. The DAP has first and second pairs of substantially parallel edges that extend along substantially the full length and full width of the DAP. The plurality of tie bars can be arranged such that both of said first pair and exactly one of said second pair of substantially parallel edges include at least one tie bar, while the other of said second pair of substantially parallel edges includes zero tie bars. The second leadframe generally defines a second plane substantially parallel to and separated from the first plane, with the second leadframe being generally positioned above or below the first leadframe. The second leadframe has a second plurality of electrical leads having a second set of one or more gaps therebetween and adapted to couple to one or more contacts on the associated primary die, the first leadframe, or both. The encapsulant is arranged such that at least some of said first plurality of electrical leads and first set of gaps and at least some of said second set of electrical leads and second set of gaps protrude from the encapsulated region, and wherein no encapsulant flash remains in any of the gaps that protrude from the encapsulated region.

In some embodiments, at least one of the first set of gaps is enlarged to align with at least one of the second set of gaps. Such gap enlargement can be accomplished by using a mold having one or more cavity bar protrusions during the process of manufacturing the integrated circuit package. In some embodiments, the DAP can have four sides, with tie bars on exactly three sides but not the fourth. In particular embodiments, opposing sides of the DAP can have exactly one tie bar each, while the third and fourth sides, also opposing each other, have exactly two and zero tie bars respectively.

In some embodiments, the first leadframe can include an outer side rail, and can also have at least one enlarged sacrificial material region that extends from the outer side rail to contact one or more tie bars within the first leadframe. In some embodiments, the device or package can include a third leadframe generally defining a third plane separate from the first and second planes, said third leadframe having a third plurality of electrical leads coupled to a plurality of contacts within the integrated circuit device or package.

In various embodiments, the second leadframe is separated from the first leadframe by a distance that remains constant at substantially all locations of both leadframes. In addition, the leadframes can be arranged in a stacked formation atop one another, which stacked formation may also accommodate the associated primary die. Further embodiments can include the associate primary die itself, a secondary integrated circuit component, such as a second die, capacitor or inductor, and/or an encapsulant that binds and protects various portions of the leadframes, primary die, secondary die, other components and/or plurality of direct electrical connectors. In addition, one or both leadframes can be leadless leadframes.

Other apparatuses, methods, features and advantages of the invention will be or will become apparent to one with skill in the art upon examination of the following figures and detailed description. It is intended that all such additional systems, methods, features and advantages be included within this description, be within the scope of the invention, and be protected by the accompanying claims.

BRIEF DESCRIPTION OF THE DRAWINGS

The included drawings are for illustrative purposes and serve only to provide examples of possible structures for the disclosed inventive apparatus and method for providing improved and reliable tie bar and mold cavity bar arrangements in the manufacture of multiple leadframe stack packages. These drawings in no way limit any changes in form and detail that may be made to the invention by one skilled in the art without departing from the spirit and scope of the invention.

DETAILED DESCRIPTION

Exemplary applications of apparatuses and methods according to the present invention are described in this section. These examples are being provided solely to add context and aid in the understanding of the invention. It will thus be apparent to one skilled in the art that the present invention may be practiced without some or all of these specific details. In other instances, well known process steps have not been described in detail in order to avoid unnecessarily obscuring the present invention. Other applications are possible, such that the following examples should not be taken as limiting.

In the following detailed description, references are made to the accompanying drawings, which form a part of the description and in which are shown, by way of illustration, specific embodiments of the present invention. Although these embodiments are described in sufficient detail to enable one skilled in the art to practice the invention, it is understood that these examples are not limiting; such that other embodiments may be used, and changes may be made without departing from the spirit and scope of the invention.

Figure 1A:
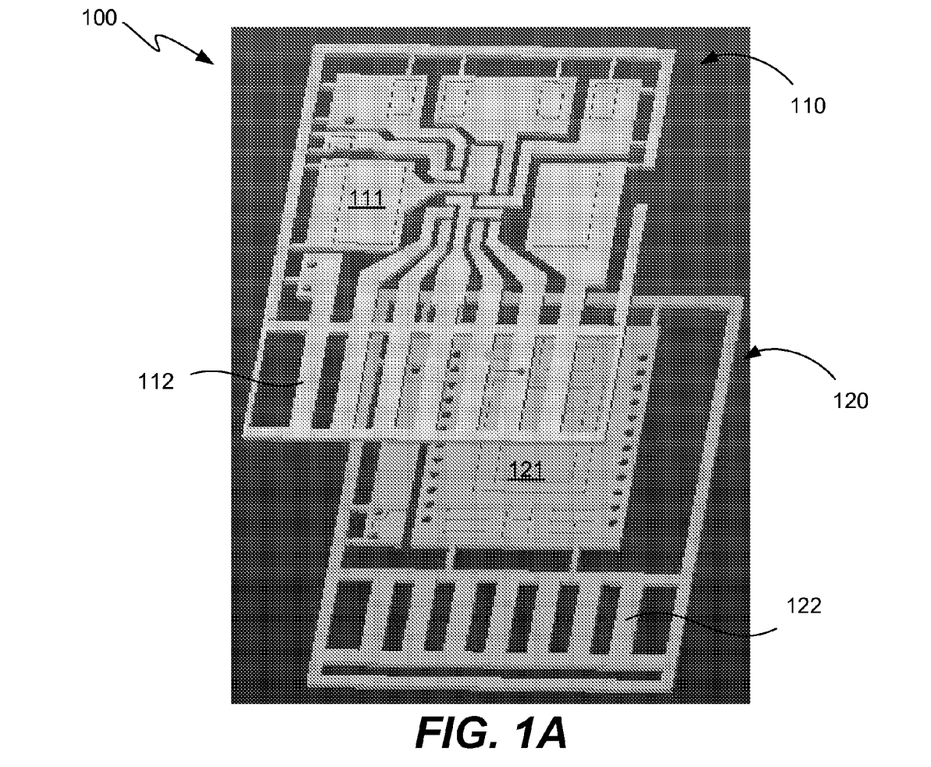
FIG. 1A illustrates in exploded top perspective view an exemplary partial multiple leadframe package according to one embodiment of the present invention.
Figure 1B:
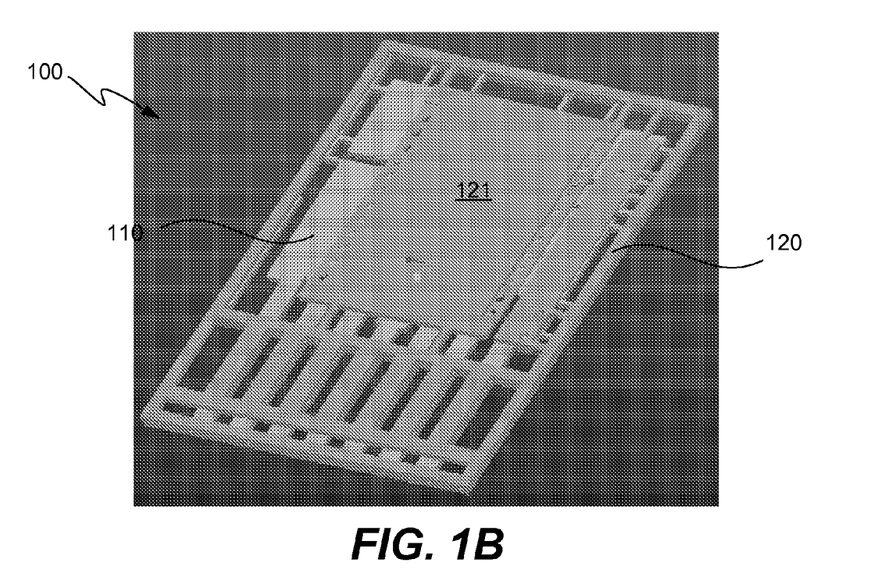
FIG. 1B illustrates in bottom perspective view the partial multiple leadframe package of FIG. 1A according to one embodiment of the present invention.

Referring first to FIGS. 1A and 1B, an exemplary partial multiple leadframe package is shown in exploded top perspective and bottom perspective views respectively. Partial multiple leadframe package 100 generally includes a top leadframe 110 and bottom leadframe 120. Although other components should be added for partial leadframe package 100 to be functional, just the separate and spaced apart first and second leadframes 110, 120 are depicted in FIGS. 1A and 1B for purposes of simplicity. As shown, top or first leadframe 110 can have one or more component attach pads 111, as well as a first plurality of electrical leads 112. Similarly, bottom or second leadframe 120 can have a die attach pad 121, as well as a second and separate plurality of electrical leads 122. While FIG. 1A shows the two leadframes 110, 120 as being apart and separated by some distance, FIG. 1B depicts a reverse angle of the two leadframes positioned atop and with respect to each other as would be appropriate for an actual packaged application.

As will be readily appreciated, top or first leadframe 110 can generally define a first plane, while bottom or second leadframe 120 can generally define a second plane that is substantially parallel to and separated from the first plane. While some parts or portions of either leadframe may diverge from their respective general planes, such as in the case of upturned edges, tabs and/or downset regions, for example, the nature of a traditional leadframe is that the majority of the leadframe resides in the same general plane. As can also be seen from the intended final respective positions in FIG. 1B, first leadframe 110 and second leadframe 120 are "stacked" with respect to one another, and also with respect to various other IC components that are to be included in a final device, such as, for example, a primary die, a secondary die, one or more inductors, one or more capacitors and the like.

In addition, one or both of first leadframe 110 and second leadframe 120 can be leadless leadframes, such as any of the variety of the leadless leadframes designed and manufactured by National Semiconductor Corporation of Santa Clara, Calif. Details regarding leadless leadframes can be found at, for example, U.S. Pat. Nos. 6,372,579 and 6,448,107, which are incorporated herein by reference. Of course, other suitable leadframe packages may also be used, and it will be understood that the present invention can be used with traditional or leadless leadframes. While the detailed description herein depicts leadless leadframes, such references are for purposes of illustration only, and it will be appreciated that the disclosed apparatuses and methods can be adapted for use with other leadframe packaging types.

Figure 2A:
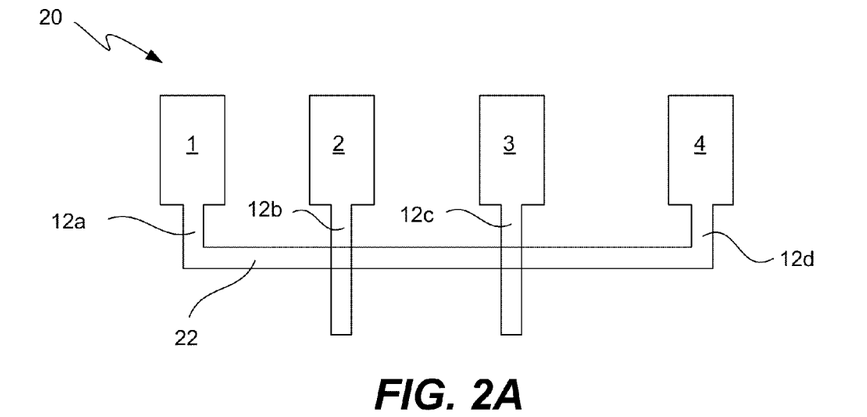
FIG. 2A illustrates in top plan view an exemplary plurality of electrical contacts and associated leads arranged in a single leadframe package.
Figure 2B:
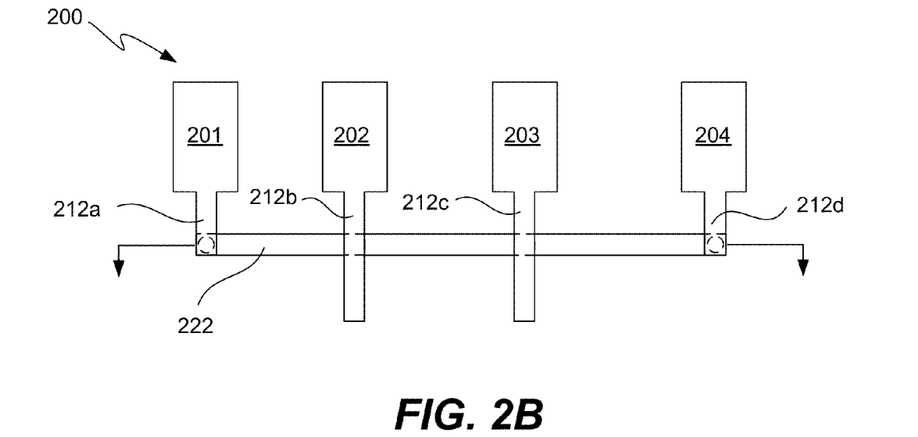
FIG. 2B illustrates in top plan view an exemplary plurality of electrical contacts and associated leads similar to those of FIG. 2A, but arranged in a multiple leadframe package according to one embodiment of the present invention.
Figure 2C:
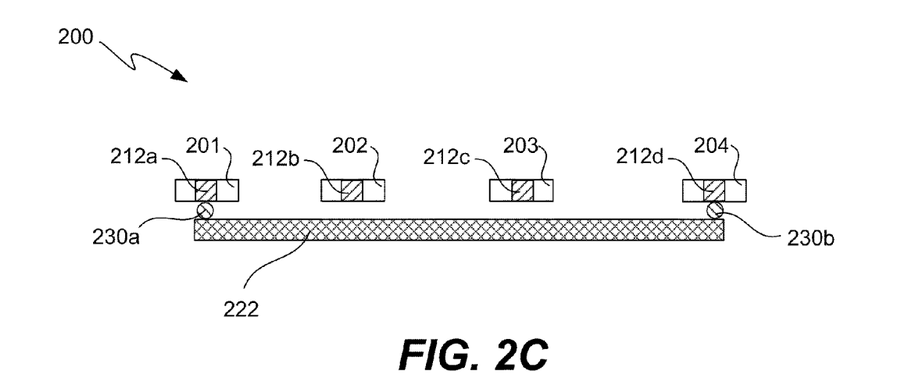
FIG. 2C illustrates in side cross-sectional view the plurality of electrical contacts and associated leads of FIG. 2B with a plurality of direct electrical connectors therebetween according to one embodiment of the present invention.

FIGS. 2A-2C collectively show some of the added flexibility introduced by way of having a multiple leadframe package, such as that which is shown in FIGS. 1A and 1B. FIG. 2A illustrates in top plan view a plurality of electrical contacts and associated leads arranged in a conventional single leadframe package. Partial single leadframe package 20 includes a plurality of electrical contacts 1, 2, 3, 4 that are coupled respectively to electrical traces 12a, 12b, 12c, 12d. In the event that a particular design calls for contact 1 to couple to contact 4, a simple and direct electrical trace 22 from trace 12a to trace 12d would need to traverse non-involved traces 12b and 12c. This presents a problem where inclusion of electrical contacts 2 and 3 is not desired with respect to the coupling of contacts 1 and 4. Accordingly, a more complex design than a simple and direct electrical trace 22 is requires for single leadframe package 20.

FIG. 2B presents in top plan view an exemplary plurality of electrical contacts and associated leads similar to those of FIG. 2A, but arranged in a multiple leadframe package according to one embodiment of the present invention. As can be seen, partial multiple leadframe package 200 of FIG. 2B generally corresponds to the partial single leadframe package 20 of FIG. 2A. Electrical contacts 201, 202, 203 and 204 are coupled to electrical traces 212a, 212b, 212c and 212d respectively. In the event that a particular design calls for contact 201 to couple to contact 204, however, a relatively simple and more direct electrical connection can be made in multiple leadframe package 200. In particular, electrical trace 222 resides on a separate leadframe located on a different plane than the plane of the leadframe that holds each of electrical contacts 201, 202, 203, 204 and electrical traces 212a, 212b, 212c, 212d.

This two plane relationship can be seen better in FIG. 2C, which illustrates the plurality of electrical contacts and associated leads of FIG. 2B with a plurality of direct electrical connectors therebetween in side cross-sectional view. It will be readily appreciated that the arrangement depicted can be identical to or at least representative of various arrangements that can be provided in the dual leadframe arrangement of FIGS. 1A and 1B. As shown, electrical contacts 201, 202, 203, 204 and corresponding electrical traces 212a, 212b, 212c, 212d all reside on a top or first leadframe, while electrical trace 222 resides on a bottom or separate leadframe that is separate and spaced apart from the top or first leadframe.

In various embodiments, at least one electrical connection to a contact on the primary associated die can follow a path that traverses along a portion of one leadframe, then across a direct electrical connector to the other leadframe, then along a portion of the other leadframe, the across another direct electrical connector back to the original leadframe, and then along another portion of the original leadframe. Direct electrical connectors 230a and 230b are used to route the electrical connection from contact 201 to contact 204 by way of electrical trace 222. In particular, an electrical connection can follow a path that traverses from contact 201 to electrical trace 212a on the first leadframe, then across direct electrical connector 230a to electrical trace 222 of the second leadframe, along electrical trace 222, then across direct electrical connector 230b back to electrical trace 212d on the original first leadframe, and then along electrical trace 212d to contact 204. Notably, electrical traces 212b and 212c are bypassed while the electrical connection still takes a rather direct route from contact 201 to contact 204, which illustrates some of the versatility of using such a dual leadframe.

Figure 3A:
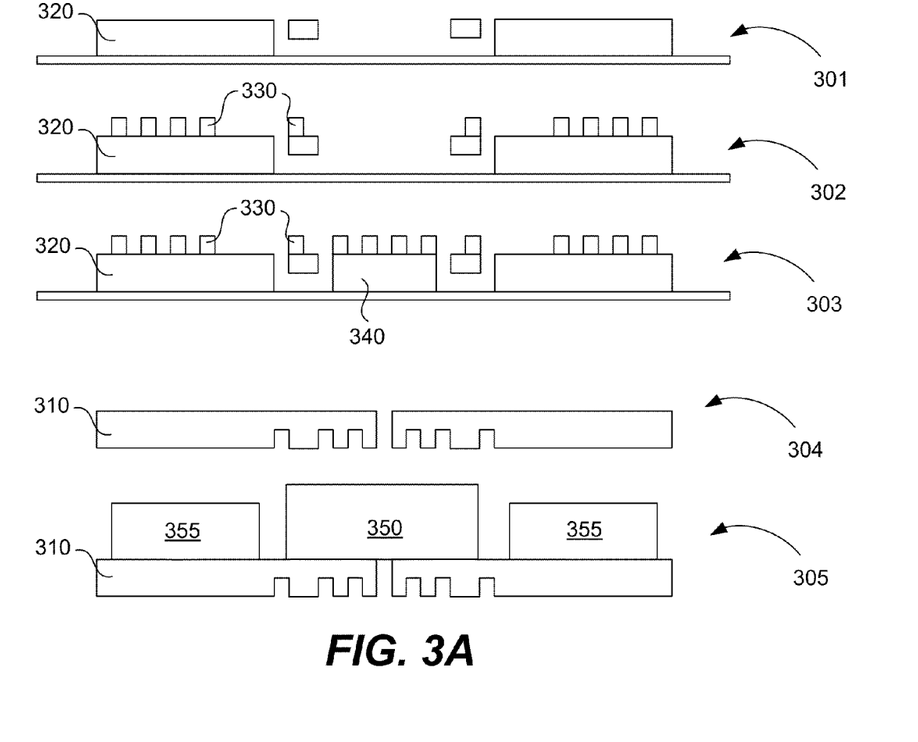
FIG. 3A illustrates in side cross-sectional view an exemplary series of components and process phases used to create a multiple leadframe IC device according to one embodiment of the present invention.

Moving next to FIG. 3A, an exemplary series of components and process phases used to create a multiple leadframe IC device according to one embodiment of the present invention is illustrated in side cross-sectional view. Phase 301 involves the creation of a bottom leadframe 320, which can be a conventional or leadless leadframe, as may be desired for a particular application. Phase 302 involves the addition of a plurality of direct electrical connectors 330 atop various locations of bottom leadframe 320. Such direct electrical connectors can be, for example, balls, tabs or other suitable components. In the event that some or all of the direct electrical connectors are tabs, a suitable tab bending process can be used to "tab" the bottom leadframe 320 accordingly. In the event that some or all of the direct electrical connectors are balls, a suitable balling machine can be used to "ball" the bottom leadframe 320 accordingly. Phase 303 involves attaching a primary die to the bottom leadframe, such as in a "dead bug" arrangement.

Phase 304 involves the creation of a top leadframe 310, which is preferably designed to mate and interact with the bottom leadframe 320. Phase 305 then involves the addition of one or more secondary IC components to the top leadframe, such as inductor 350 and two capacitors 355, among other numerous possibilities and arrangements. Additional phases not depicted can include the bonding of the top leadframe 310 to the bottom leadframe 320, such as by reflowing some or all of the direct electrical connectors 330, and then the addition of an encapsulant around the various package components.

Figure 3B:
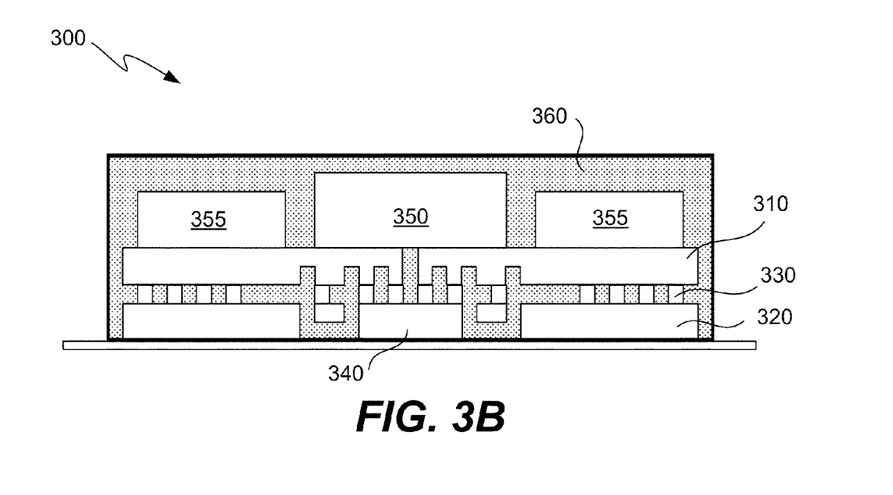
FIG. 3B illustrates in side cross-sectional view an exemplary multiple leadframe IC device resulting from the series of components and process phases depicted in FIG. 3A according to one embodiment of the present invention.

The completed device is provided in FIG. 3B, which illustrates in side cross-sectional view the exemplary multiple leadframe IC device resulting from the series of components and process phases depicted in FIG. 3A. As shown, SIP 300 includes a top or first leadframe 310, a bottom or second leadframe 320, a plurality of direct electrical connectors 330, a primary die 340, an inductor 350, two capacitors 355 and an encapsulant 360 that surrounds all or most of these various components. As will be readily appreciated, IC device or SIP 300 can have significantly more and varied components without departing from the basic nature of the dual stacked leadframe arrangement presented. Furthermore, one or more secondary or additional dice can be added, either in addition to or instead of the inductor 350 and/or capacitors 355, such that effectively a resulting MCM is formed. Although not depicted, it will also be appreciated that a third and possibly further leadframes may also be added to the package in a similar stacked manner, as may be desired.

As noted above, one or more direct electrical connectors, such as balls or tabs, can be used to provide electrical connections between the first and second leadframes. Further details regarding such direct electrical connectors, as well as various other details regarding a multiple leadframe packaged device, can be found in commonly owned and co-pending U.S. patent application Ser. No. 12/581,065 by Bayan, filed Oct. 16, 2009 and entitled "Multiple Leadframe Package," which is incorporated by reference herein for all purposes. Such direct electrical connectors can not only provide for electrical contacts between leadframes, but can also be used to control spacing between separate leadframes, as noted in the foregoing reference. Additional issues can also arise due to the complexity involved in creating packages having multiple leadframes. Such issues can involve, for example, the inefficient use of materials just to maintain structural integrity, as well as the overlapping of closely spaced leadframes that leads to problems with mold flash removal, among others.

Figure 4A:
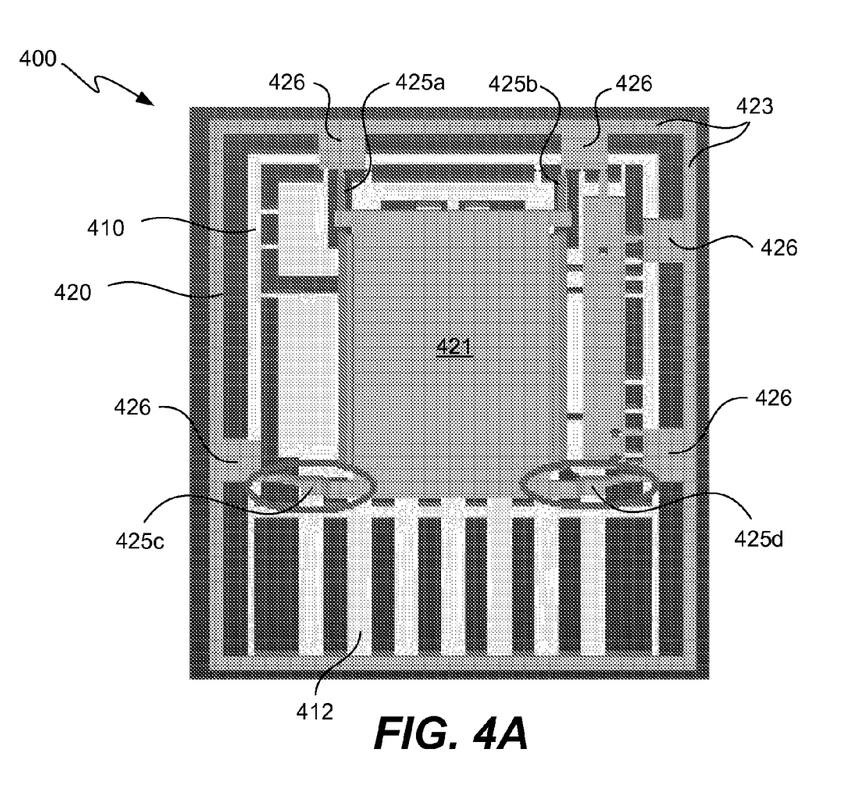
FIG. 4A illustrates in bottom plan view an alternative exemplary partial multiple leadframe package according to one embodiment of the present invention.
Figure 4B:
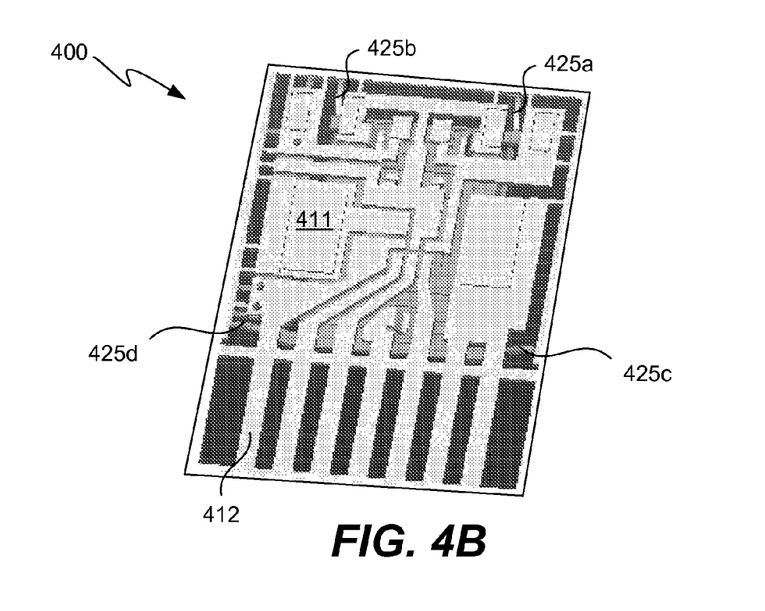
FIG. 4B illustrates in top perspective view the partial multiple leadframe package of FIG. 4A according to one embodiment of the present invention.

Turning next to FIGS. 4A and 4B, an alternative exemplary partial multiple leadframe package according to one embodiment of the present invention is illustrated in bottom plan and top perspective views respectively. Partial multiple leadframe package 400 generally includes a top leadframe 410 and bottom leadframe 420. Although other components should be added for partial leadframe package 400 to be functional, just the separate and spaced apart first and second leadframes 410, 420 are depicted in FIGS. 4A and 4B for purposes of simplicity. As shown, top or first leadframe 110 can have one or more component attach pads 411, as well as a first plurality of electrical leads 412, which can have one or more gaps therebetween, as shown. Similarly, bottom or second leadframe 420 can have a die attach pad 421, as well as a second and separate plurality of various electrical leads, which can also have one or more gaps therebetween.

Similar to the foregoing example, top or first leadframe 410 can generally define a first plane, while bottom or second leadframe 420 can generally define a second plane that is substantially parallel to and separated from the first plane. While some parts or portions of either leadframe may diverge from their respective general planes, such as in the case of upturned edges, tabs and/or downset regions, for example, the nature of a traditional leadframe is that the majority of the leadframe resides in the same general plane. For example, DAP 421 is downset from the remainder of bottom leadframe 420. As seen in the final respective positions in FIGS. 4A and 4B, top leadframe 410 and bottom leadframe 420 can be "stacked" with respect to one another, and also with respect to various other IC components that are to be included in a final device, such as, for example, a primary die, a secondary die, one or more inductors, one or more capacitors and the like. In addition, one or both of first leadframe 110 and second leadframe 120 can be leadless leadframes. Of course, other suitable leadframe packages may also be used, and it will be understood that the present invention can be used with traditional or leadless leadframes.

DAP 421 can be generally square or rectangular in nature. Accordingly, DAP 421 can have two pairs of substantially parallel edges that extend along substantially the full length and full width of the die attach pad, as shown. Suitable alternative shapes and/or sizes for a DAP may be used, although such alternatives should also take into consideration appropriate arrangements for associated tie bars or other suitably connecting components to aid in the manufacturing process. Further, one or more edges of DAP 421 may be upturned to aid with the manufacturing process of the overall packaged assembly, as will be readily appreciated.

A plurality of tie bars 425 can be coupled to DAP 421 in a variety of arrangements. In the example shown, two tie bars 425a, 425b are coupled to a top edge of DAP 421, a single tie bar 425c is coupled to one side edge of the DAP, and another tie bar 425d is coupled to an opposing side edge of the DAP. No tie bars are coupled to the bottom edge of the DAP that is opposite the top DAP edge having the first two tie bars 425a and 425b. This tie bar configuration shown in FIGS. 4A and 4B is notably different than various traditional tie bar configurations, such as that which is shown for the DAP based leadframe 120 in FIGS. 1A and 1B, for example. As shown in FIGS. 1A and 1B, some DAPs can have multiple tie bars extending from each of one pair of opposing DAP edges, such as top and bottom edges, and no tie bars extending from either of another pair of opposing DAP edges, such as side edges. In such arrangements, one set of tie bars can attach to, for example, an outer side rail of the leadframe, while an opposing set of tie bars can attach to a dam bar located within the leadframe for the lateral support of various leadframe components.

Conversely, DAP based bottom leadframe 420 in the partial multiple leadframe package 400 of FIGS. 4A and 4B has had a significant amount of material removed and/or rearranged. For example, no dam bar beneath DAP 421 exists, and various additional leads have been removed. Such an arrangement can result in cost savings due to a reduced amount of material used, such as where fewer leads in a particular leadframe are desired. Structural support for DAP 421 is still needed, however, and such support can be provided through a locational reworking of the respective tie bars, among other possibilities. For example, tie bars that might typically extend away from the bottom edge of DAP 421 can be relocated to both of the side edges of the DAP, as shown. In this manner, one pair of substantially parallel DAP edges each includes one tie bar, while the other pair of substantially parallel edges has one edge that includes two tie bars and another edge that has zero tie bars. Of course, alternative arrangements can also be used, such as one that might include multiple tie bars on each of three edges, but zero on the bottom or other fourth edge.

In addition to their location or arrangement, one or more of the plurality of tie bars 425 can include a downsetting feature worked therein, such that DAP 421 is downset from the rest of bottom leadframe 410, as shown. Still further, bottom leadframe 420 can have one or more enlarged sacrificial material regions 426 that can be disposed adjacent to an outer side rail 423. One or more, or even all, of the various tie bars 425 can attach at one end to an enlarged sacrificial material region 426 and at the other end to DAP 421 or another bottom leadframe component or feature. The use of such enlarged sacrificial material regions 426 can allow for greater flexibility in design, while also providing firm structural support to the bottom leadframe prior to the cutting of any tie bars, as will be readily appreciated. The use of such enlarged sacrificial material regions 426 can also allow for the use of one or more cavity bar protrusions in a mold component used to form the encapsulated region, as set forth below. As shown, such enlarged sacrificial material regions 426 can be square or rectangular in nature, although other suitable alternative shapes and sizes may also be used, as desired. Various tie bar necking and encapsulant related features that can be used for partial multiple leadframe package 400 are set forth in greater detail below.

Figure 5A:
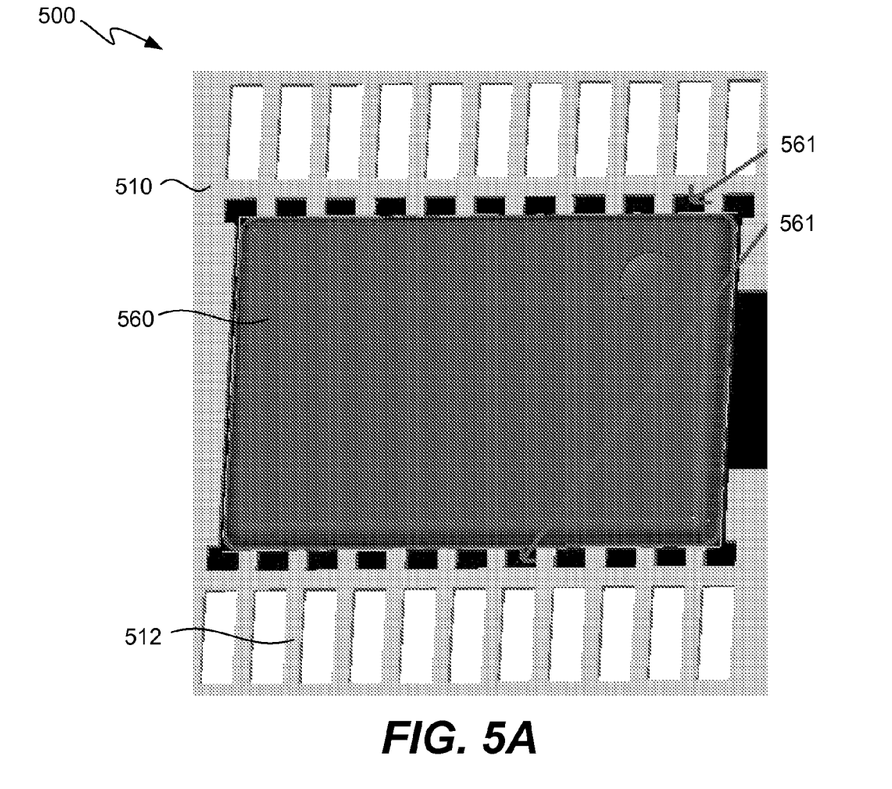
FIG. 5A illustrates in top plan view an exemplary encapsulated region and surrounding area of a single leadframe package prior to mold flash removal.
Figure 5B:
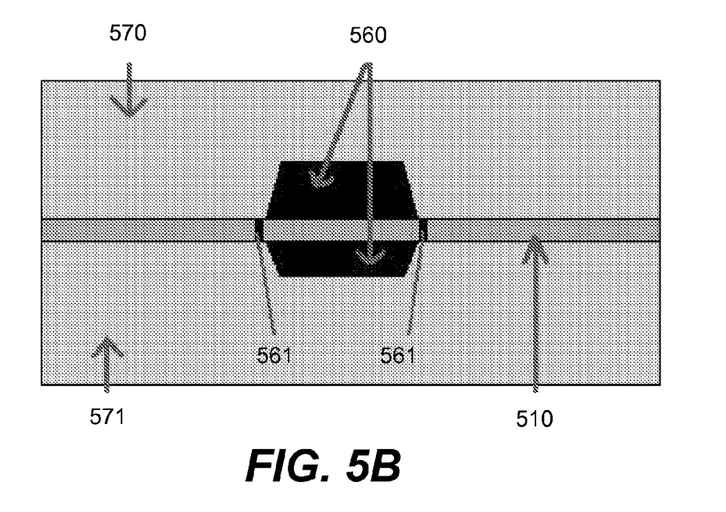
FIG. 5B illustrates in side cross-sectional view the single leadframe package of FIG. 5A.

FIGS. 5A and 5B depict in top plan and side cross-sectional views respectively an exemplary encapsulated region and surrounding area of a single traditional leadframe package prior to mold flash removal. Traditional single leadframe package 500 generally includes a leadframe 510 having a plurality of electrical leads 512 that extend from an encapsulated region 560. The plurality of extending electrical leads 512 can have one or more gaps therebetween, as shown. One or more device components (not shown) can be encapsulated or molded within encapsulated region 560, as will be readily understood. As part of the encapsulation process, a plurality of mold flashes or encapsulation residuals 561 can be left between the gaps of the plurality of electrical leads 512.

As is generally known in the art, a top mold 570 and bottom mold 571 can be used to help form the encapsulated region 560. In a typical encapsulation or molding process, mold halves or components 570, 571 each have an internal cavity formed therein such that a liquid encapsulant can be injected or otherwise placed therebetween and cured to form encapsulated region 560. The nature of such a process typically results in mold flash or residuals 561 in the gaps between the electrical leads 512 of leadframe 510 that extend outside the encapsulated region 560. Such mold flash 561 is common, and is typically removed by poking or pulling the mold flash from the gaps between leads after the mold halves are removed, such as by blasts of air or liquid, or other poking or pulling means, as will be readily appreciated.

Figure 6A:
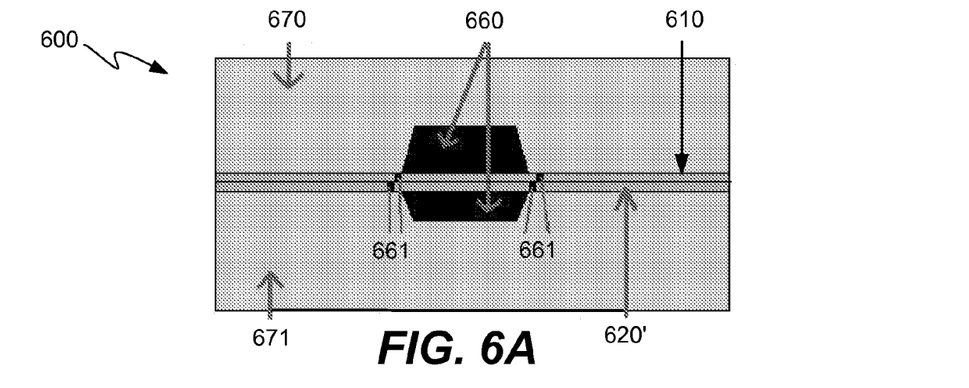
FIG. 6A illustrates in side cross-sectional view an exemplary encapsulated region and surrounding area of a multiple leadframe package according to one embodiment of the present invention.
Figure 6B:
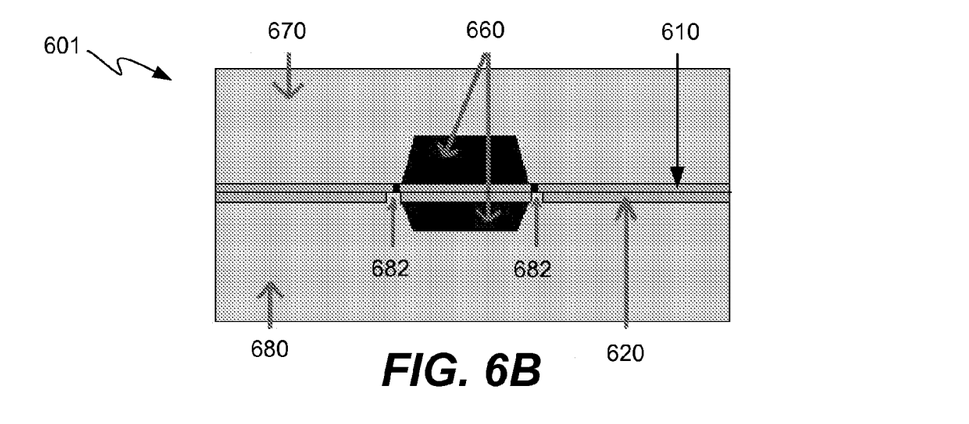
FIG. 6B illustrates in side cross-sectional view an alternative exemplary encapsulated region and surrounding area of a multiple leadframe package according to one embodiment of the present invention.

Moving now to FIGS. 6A and 6B, exemplary encapsulated regions and surrounding areas for different exemplary multiple leadframe packages are shown in side cross-sectional view. FIG. 6A depicts a multiple leadframe package 600 having a top leadframe 610, bottom leadframe 620' having gaps 661 between electrical leads that extend outside of encapsulated region 660. Top mold 670 and bottom mold 671 are used to form the encapsulated region 660, with mold flash being left behind in the various gaps 661 as a result. Unfortunately, the various gaps 661 in top and bottom leadframes 610, 620' do not align well with each other, such that the electrical leads or other portions from one leadframe blocks some gaps in the other leadframe, and vice versa. Such an arrangement can pose problems with respect to the removal of mold flash, which may be difficult or impossible to remove. This can then lead to negative consequences in the further processing, functioning and/or marketability of a finished product based on multiple leadframe package 600.

Meanwhile, FIG. 6B depicts a multiple leadframe package 601 having an identical or substantially similar encapsulated region 620 and also an identical or substantially similar top leadframe 610 that can be formed from an identical or substantially similar top mold 670. Unlike multiple leadframe package 600, however, bottom leadframe 620 of multiple leadframe package 601 can be somewhat different than the other exemplary bottom leadframe 620'. In particular, bottom leadframe 620 can have gaps between electrical leads external to encapsulated region 620, which gaps are larger or otherwise better aligned with the gaps that are present in top leadframe 610. Such an aligned gapping arrangement can be created by using a customized bottom mold 680 having customized cavity bar protrusions 682 therein. These cavity bar protrusions 682 of bottom mold 680 can be designed such that at least a partial alignment is had between some or all gaps in top leadframe 610 and bottom leadframe 620. During the encapsulation process, no molding or encapsulant fills the gaps in the bottom leadframe 620 where the protrusions 682 extend upward. Any mold flash that occurs in the gaps of the top leadframe 610 can then be poked or pulled out later via a conventional or other suitable flash removal process.

Figure 6C:
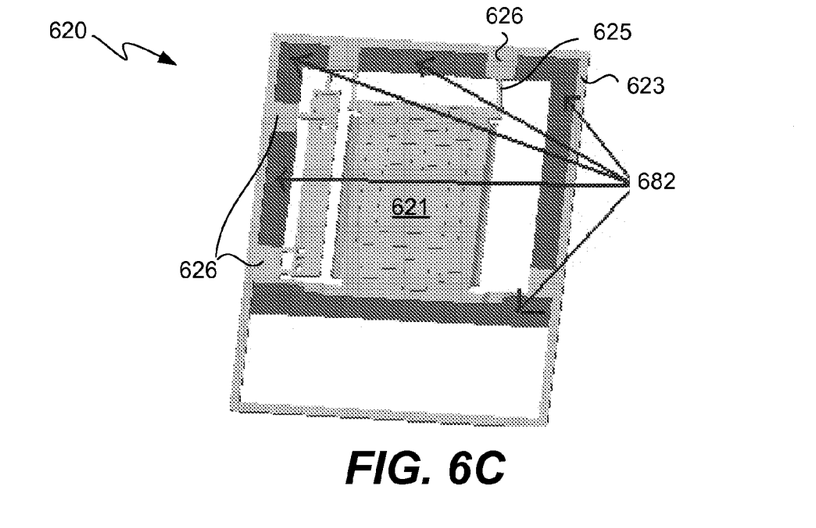
FIG. 6C illustrates in top perspective view an exemplary step in the molding process of the bottom leadframe from the multiple leadframe package of FIG. 6B according to one embodiment of the present invention.

FIG. 6C illustrates in top perspective view an exemplary step in the molding process of the bottom leadframe from the multiple leadframe package of FIG. 6B according to one embodiment of the present invention. As shown, bottom leadframe 620 is placed atop a customized bottom mold having a plurality of cavity bar protrusions 682 extending upward therefrom. Various components of bottom leadframe 620 can be identical or substantially similar to components from earlier exemplary bottom leadframes, such as bottom leadframe 420, for example. Such components of bottom leadframe 620 can include DAP 621, outer side rail 623, one or more tie bars 625, and one or more enlarged sacrificial material regions 626. In particular, the use of enlarged sacrificial material regions 626 allow for the use of the cavity bar protrusions 682, since many molding technologies are not precise enough to allow for the tight tolerances that are required in the formation of narrow tie bars.

Figure 6D:
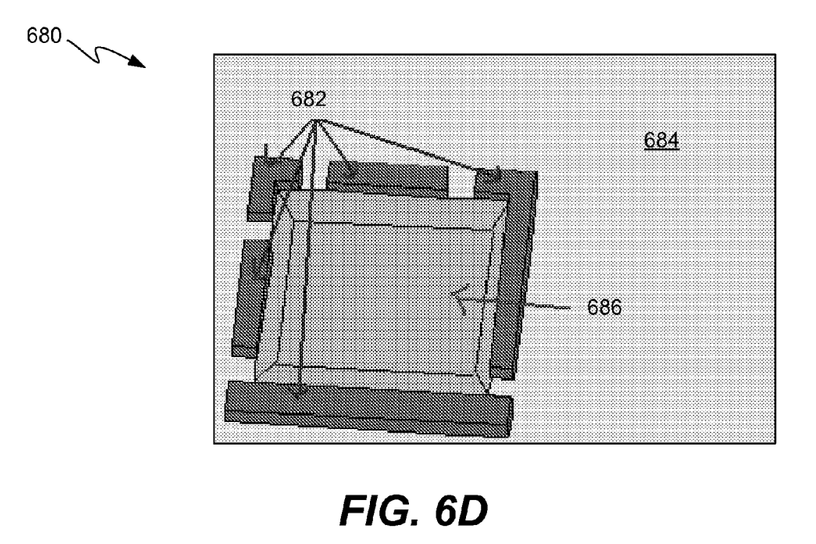
FIG. 6D illustrates in top perspective view an exemplary bottom cavity mold used to form the bottom leadframe of FIG. 6C according to one embodiment of the present invention.

Moving now to FIG. 6D, an exemplary bottom cavity mold used to form the bottom leadframe of FIG. 6C is provided in top perspective view. Bottom cavity mold 680 can include various strategically place cavity bar protrusions 682, as noted above. In addition, bottom cavity mold can generally define a flat region 684 that tends to contact the bottom leadframe at several locations during the encapsulation process, as well as a cavity region 686 that allows the formation of the encapsulated region around a primary die, portions of both leadframes, and any other components that are desired to be within the encapsulated region. As will be understood, the cavity region 686 generally extends in one direction away from the plane of flat region 684 (i.e., into the page), while the cavity bar protrusions 682 generally extend in the other direction away from the plane of the flat region (i.e., up from the page).

In addition to preventing the formation of mold flash in various strategic regions of bottom leadframe 620, the plurality of cavity bar protrusions 682 can also provide structural rigidity to the overall package or device during the encapsulation process. Of course, the customized bottom mold 680 and its various cavity bar protrusions 682 are then removed from the bottom leadframe after the encapsulation process. The final result of using top mold 670 and customized bottom mold 680 is to form an encapsulant that binds and protects various portions of the top and bottom leadframes, a primary die and other potential components with an encapsulated region in a preferable manner. In particular, the encapsulated region results in at least some electrical leads and gaps therebetween from both of the top and bottom leadframes that protrude therefrom in such a manner such that no encapsulant or mold flash remains in any of the gaps in either the top or bottom leadframe. Again, this is accomplished by the use of one or more cavity bar protrusions, which can result in the alignment of gaps, such as by enlarging one or more gaps in one or more leadframes.

Another problem that can arise in the formation of a relatively complex package or device having multiple leadframes is the structural stability of rearranged or otherwise nontraditional tie bars. Continuing with FIG. 7, an exemplary enlarged sacrificial material region and necked tie bars adjacent to an outer side rail of the bottom leadframe of FIG. 6C are illustrated in close-up top perspective view. It will be understood that bottom leadframe 720 of FIG. 7 can be identical or substantially similar to bottom leadframe 620 of FIG. 6C. As such, bottom leadframe 720 can include DAP 721 having one or more upturned edges, outer side rail 723, and one or more DAP tie bars 725 that can couple the DAP to one or more enlarged sacrificial material regions 726. Further, bottom leadframe 720 can also include one or more additional attach pads 727 having one or more other component tie bars 728 that also attach to the one or more enlarged sacrificial material regions 726.

Figure 7:
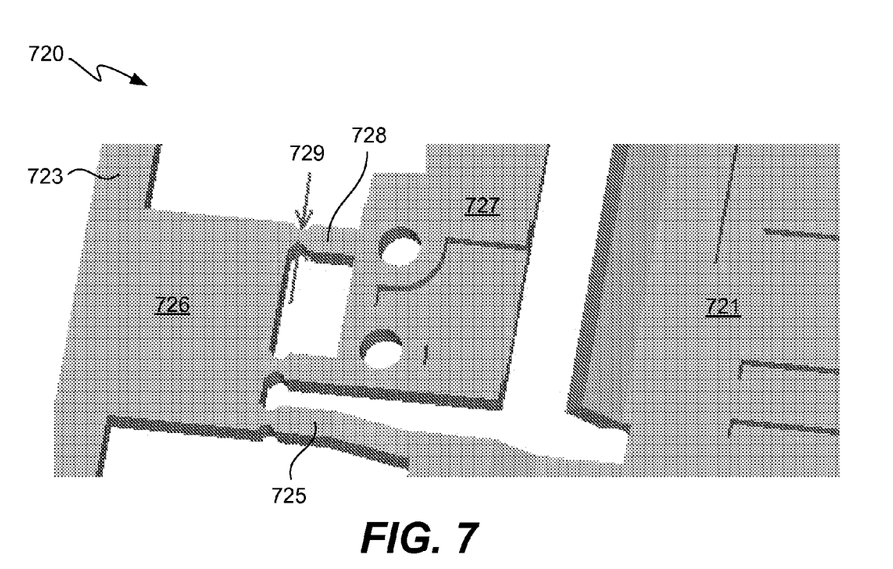
FIG. 7 illustrates in close-up top perspective view an exemplary enlarged sacrificial material region and necked tie bars adjacent to an outer side rail of the bottom leadframe of FIG. 6C according to one embodiment of the present invention.

One or more of the DAP tie bars 725 and/or other component tie bars 728 can further include a necking region 729. Such a necking region 729 can serve to help with the tie bar cutting process, while also allowing for tie bars 725, 728 and/or enlarged sacrificial material regions 726 that are otherwise comparatively large, so as to provide additional structural support to the overall leadframe 720 during various manufacturing processes. Necking region 729 can help with the trim and form processes by easing stresses that may be introduced during singulation, which stresses can lead to overall package cracking and reliability failure. As noted above, one or more DAP tie bars 725 can include a downsetting feature incorporated therein, such that DAP 721 can be downset or otherwise offset from the remainder of bottom leadframe 720. Other tie bars 728 can also include a similar downsetting or offsetting feature, in the event that their one or more respective additional attach pads 727 are desired to be offset, as will be readily appreciated.

Figure 8A:
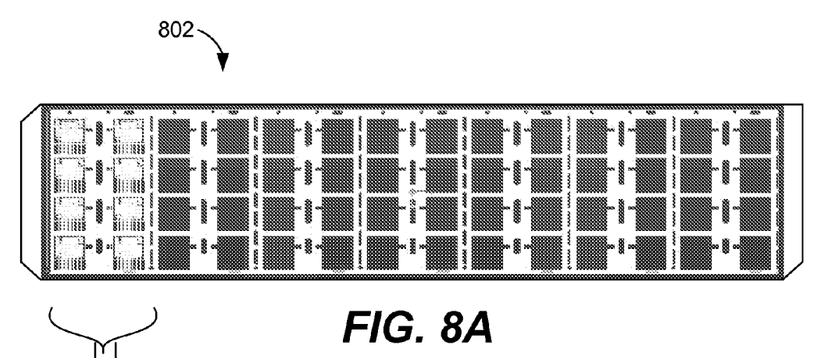
FIG. 8A illustrates in top plan view an exemplary multiple leadframe panel containing a plurality of device arrays, each having a plurality of electrical interconnect patterns according to one embodiment of the present invention.
Figure 8B:
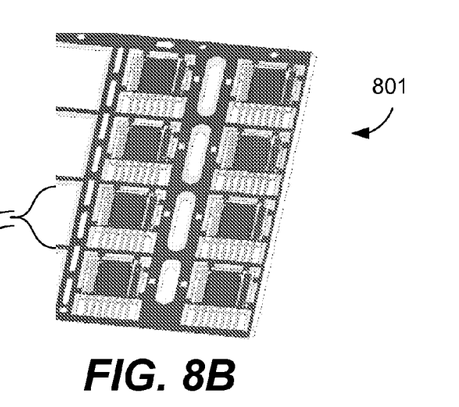
FIG. 8B illustrates in top plan view an exemplary multiple leadframe device array from the panel FIG. 8A according to one embodiment of the present invention.
Figure 8C:
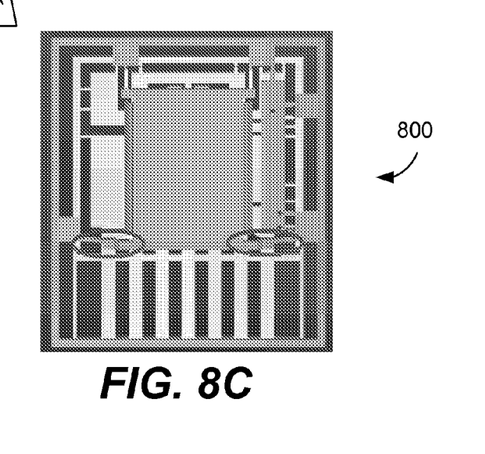
FIG. 8C illustrates in top plan view an exemplary multiple leadframe electrical interconnect pattern from the device array of FIG. 8B according to one embodiment of the present invention.

Turning next to FIGS. 8A-8C, various structures representative of the mass production of multiple leadframe packages are provided, all in top plan view. FIG. 8A illustrates an exemplary multiple leadframe panel 802 containing a plurality of device arrays, each having a plurality of electrical interconnect patterns, FIG. 8B illustrates an exemplary multiple leadframe device array 801 from the panel FIG. 8A, and FIG. 8C illustrates an exemplary multiple leadframe electrical interconnect pattern 800 from the device array of FIG. 8B. As will be readily appreciated, the multiple leadframe electrical interconnect pattern 800 generally corresponds to and can be identical or substantially similar to the partial multiple leadframe package 400 of FIGS. 4A and 4B discussed above. As shown in FIGS. 8A-8C, a typical set of multiple leadframe packages can involve the formation of a copper leadless leadframe strip or panel 802 that is patterned to define a plurality of device arrays or matrices 801 of individual semiconductor device areas or electrical interconnect patterns 800.

Panel 802 can be formed by etching one or more relatively thin conductive metal layers, such as copper, into specific electrical interconnect patterns, as shown. Such metal layers for panel 802 can have a thickness of about 100 to 300 microns, such that the entire finished panel is relatively thin, yet still has enough structural integrity to be transported about and processed without breaking. Although the primary function of the various patterns, that being to provide electrical interconnects between components, can be accomplished with patterns that are substantially thinner than those in panel 802, the typical thicknesses of these panels are typically much larger, such that the panels are sturdy enough to be readily processed. One drawback of panels that are thicker than necessary for their primary function, however, is that additional material is used, which can drive up materials costs. The drawback of such added materials costs can be aggravated when such panels are made from more valuable or expensive metals, such as copper, silver and/or gold.

Figure 9:
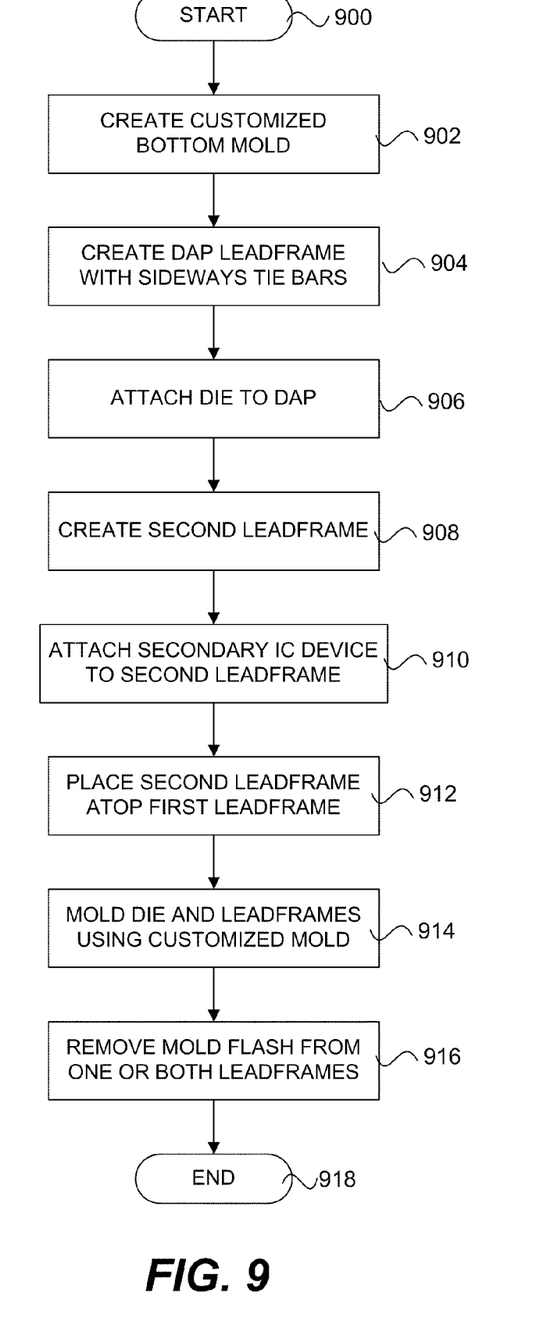
FIG. 9 presents a flowchart of an exemplary method of manufacturing the IC device of FIG. 4A according to one embodiment of the present invention.

Turning lastly to FIG. 9, a flowchart of one exemplary method of manufacturing the IC device of FIG. 4A according to one embodiment of the present invention is provided. It will be readily appreciated that the method provided herein is merely exemplary, and that the present invention may be practiced in a wide variety of suitable ways. While the provided flowchart may be comprehensive in some respects, it will be readily understood that not every step provided is necessary, that other steps can be included, and that the order of steps might be rearranged as desired by a given manufacturer, as desired.

After start step 900, a customized bottom mold is created at a first process step 902. Such a customized bottom mold can have one or more custom cavity bar protrusions that affect mold flash creation, as discussed above. At subsequent process step 904, a first leadframe having a DAP and an alternative tie bar arrangement is created. Such an alternative tie bar arrangement can have tie bars that are directed sideways as well as from the top of the DAP, as discussed in detail above. At following process step 906, a primary die is attached to a DAP of the first leadframe. At process step 908, a second leadframe is created, and at subsequent process step 910, one or more secondary IC devices are attached to the second leadframe. Such secondary IC devices can be one or more additional dice, inductors, and/or capacitors, among other components. At following process step 912, the second leadframe can be placed atop or otherwise stacked against the first leadframe. The customized bottom mold can then be used at process step 914 to encapsulate or mold the various dice, leadframes, connectors, and/or secondary IC components within an encapsulated region, as discussed above. Any resulting mold flash can then be readily removed at process step 916, due to encapsulant formation with the customized mold.

The method then ends at end step 918. As will be appreciated, various steps may be omitted, added and/or performed in a different order, as may be preferred. For example, a second leadframe may be created and one or more secondary devices may be attached to the second leadframe at any point between the listed start step 900 and their actual respective process steps. As another example, the customized bottom mold can be created at a later stage in the process than the recited initial process step.

Although the foregoing invention has been described in detail by way of illustration and example for purposes of clarity and understanding, it will be recognized that the above described invention may be embodied in numerous other specific variations and embodiments without departing from the spirit or essential characteristics of the invention. Certain changes and modifications may be practiced, and it is understood that the invention is not to be limited by the foregoing details, but rather is to be defined by the scope of the appended claims.

What is claimed is:

1. An integrated circuit package, comprising:
   a first leadframe generally defining a first plane and having
      a first plurality of electrical leads adapted to couple to one or more contacts on an associated primary die, said first plurality of electrical leads having a first set of one or more gaps therebetween,
      a die attach pad adapted to couple to the associated primary die and having a first pair and a second pair of substantially parallel edges that extend along substantially the full length and full width of the die attach pad, and a plurality of tie bars coupled to said die attach pad, wherein both of said first pair and exactly one of said second pair of substantially parallel edges include at least one tie bar, while the other of said second pair of substantially parallel edges includes zero tie bars;

a second leadframe generally defining a second plane substantially parallel to and separated from said first plane, said second leadframe being generally positioned above or below said first leadframe, said second leadframe having
a second plurality of electrical leads coupled to one or more contacts on said associated primary die, one or more contacts on said first leadframe, or both, said second plurality of electrical leads having a second set of one or more gaps therebetween; and an encapsulant that binds and protects various portions of said first leadframe and said second leadframe within an encapsulated region such that at least some of said first plurality of electrical leads and first set of gaps and at least some of said second set of electrical leads and second set of gaps protrude from said encapsulated region, wherein no encapsulant flash remains in any of said first set of gaps or second set of gaps that protrude from said encapsulated region.

2. The integrated circuit package of claim 1, wherein at least one of said first and second leadframes comprises a leadless leadframe.

3. The integrated circuit package of claim 1, wherein at least one of said first set of gaps is enlarged to align with at least one of said second set of gaps.

4. The integrated circuit package of claim 3, wherein said gap enlargement is accomplished by using a mold having one or more cavity bar protrusions during the process of manufacturing said integrated circuit package.

5. The integrated circuit package of claim 1, further including:
said associated primary die.

6. The integrated circuit package of claim 4, wherein said associated primary die, said first leadframe and said second leadframe are substantially stacked atop one another.

7. The integrated circuit package of claim 1, wherein said first leadframe comprises an outer side rail, and wherein at least one enlarged sacrificial material region adjacent to said outer side rail extends from said outer side rail to contact one or more tie bars within said first leadframe.

8. The integrated circuit package of claim 1, further including:
a third leadframe generally defining a third plane separate from said first and second planes, said third leadframe having a third plurality of electrical leads coupled to a plurality of contacts within said integrated circuit package.

9. An integrated circuit device, comprising:
a first die having a plurality of contacts thereon;
a first leadframe generally defining a first plane and having
a first plurality of electrical leads coupled to said first die,
a die attach pad coupled to said first die and having a first pair and a second pair of substantially parallel edges that extend along substantially the full length and full width of the die attach pad, and
a plurality of tie bars coupled to said die attach pad, wherein both of said first pair and exactly one of said second pair of substantially parallel edges include at least one tie bar, while the other of said second pair of substantially parallel edges includes zero tie bars;

a second leadframe generally defining a second plane substantially parallel to and separated from said first plane, said second leadframe having a second plurality of electrical leads coupled to said first die, said first leadframe, or both; and an encapsulant that binds and protects various portions of said first die, said first leadframe and said second leadframe within an encapsulated region wherein said first plurality of electrical leads includes a first set of one or more gaps therebetween, wherein said second plurality of electrical leads includes a second set of one or more gaps therebetween, wherein said encapsulant surrounds device components such that at least some of said first plurality of electrical leads and first set of gaps and at least some of said second set of electrical leads and second set of gaps protrude from said encapsulated region, and wherein no encapsulant flash remains in any of said first set of gaps or second set of gaps that protrude from said encapsulated region.

10. The integrated circuit device of claim 9, wherein said first leadframe comprises an outer side rail, and wherein at least one enlarged sacrificial material region adjacent to said outer side rail extends from said outer side rail to contact one or more tie bars within said first leadframe.

11. The integrated circuit device of claim 10, wherein one or more of said plurality of tie bars couples said die attach pad to said at least one enlarged sacrificial material region.

12. The integrated circuit device of claim 11, wherein one or more of said plurality of tie bars provides a downsetting feature such that said die attach pad is downset from said outer side rail.

13. The integrated circuit device of claim 10, wherein at least one of said one or more tie bars includes a necked portion near its respective enlarged sacrificial material region.

14. An integrated circuit device, comprising:
a first die having a plurality of contacts thereon;
a first leadframe generally defining a first plane and having
a die attach pad coupled to said first die and a first plurality of electrical leads coupled to said first die, said first plurality of electrical leads having a first set of one or more gaps therebetween;
a second leadframe generally defining a second plane substantially parallel to and separated from said first plane, said second leadframe being generally positioned above or below said first leadframe, said second leadframe having a second plurality of electrical leads coupled to said first die, one or more contacts on said first leadframe, or both, said second plurality of electrical leads having a second set of one or more gaps therebetween; and
an encapsulant that binds and protects various portions of said first die, said first leadframe and said second leadframe within an encapsulated region such that at least some of said first plurality of electrical leads and first set of gaps and at least some of said second set of electrical leads and second set of gaps protrude from said encapsulated region, wherein no encapsulant flash remains in any of said first set of gaps or second set of gaps that protrude from said encapsulated region.

15. The integrated circuit device of claim 14, wherein at least one of said first set of gaps is enlarged to align with at least one of said second set of gaps.

16. The integrated circuit device of claim 15, wherein said gap enlargement is accomplished by using a mold having one or more cavity bar protrusions during the process of manufacturing said integrated circuit package.

17. The integrated circuit device of claim 14, wherein said first leadframe further includes an outer side rail, and wherein at least one enlarged sacrificial material region adjacent to said outer side rail extends from said outer side rail to contact one or more tie bars within said first leadframe.

18. The integrated circuit device of claim 17, wherein at least one of said one or more tie bars couples said die attach pad to said at least one enlarged sacrificial material region.

* * * * *